(12) United States Patent
Lu et al.

(10) Patent No.: US 11,999,895 B1
(45) Date of Patent: Jun. 4, 2024

(54) LIQUID COOLING WHILE PREVENTING ELECTRONIC DAMAGE

(71) Applicant: Aojiang (Wuxi) Network Energy Co., Ltd., Wuxi (CN)

(72) Inventors: Jianmei Lu, Suzhou (CN); Qingfeng Xu, Suzhou (CN); Wenwu Feng, Suzhou (CN)

(73) Assignee: Aojiang (Wuxi) Network Energy Co., Ltd., Wuxi (CN)

( * ) Notice: Subject to any disclaimer, the term of this patent is extended or adjusted under 35 U.S.C. 154(b) by 0 days.

(21) Appl. No.: 18/407,417

(22) Filed: Jan. 8, 2024

(51) Int. Cl.
C09K 5/04 (2006.01)
H05K 7/20 (2006.01)

(52) U.S. Cl.
CPC ............. *C09K 5/048* (2013.01); *H05K 7/203* (2013.01); *H05K 7/20318* (2013.01); *H05K 7/20381* (2013.01)

(58) Field of Classification Search
CPC . H05K 7/203; H05K 7/20318; H05K 7/20381
See application file for complete search history.

(56) References Cited

U.S. PATENT DOCUMENTS

| | | | | |
|---|---|---|---|---|
| 5,401,429 A | * | 3/1995 | Flynn | C11D 7/5068 134/40 |
| 2010/0029532 A1 | * | 2/2010 | Minor | C11D 7/5063 510/177 |

* cited by examiner

*Primary Examiner* — Emmanuel E Duke

(57) ABSTRACT

A perfluoro compound includes perfluorobutyl ethylene (PFBE) and a fluoroalkane. The perfluoro compound has an azeotropic point between 40 degrees Celsius and 60 degrees Celsius, inclusive.

20 Claims, 11 Drawing Sheets

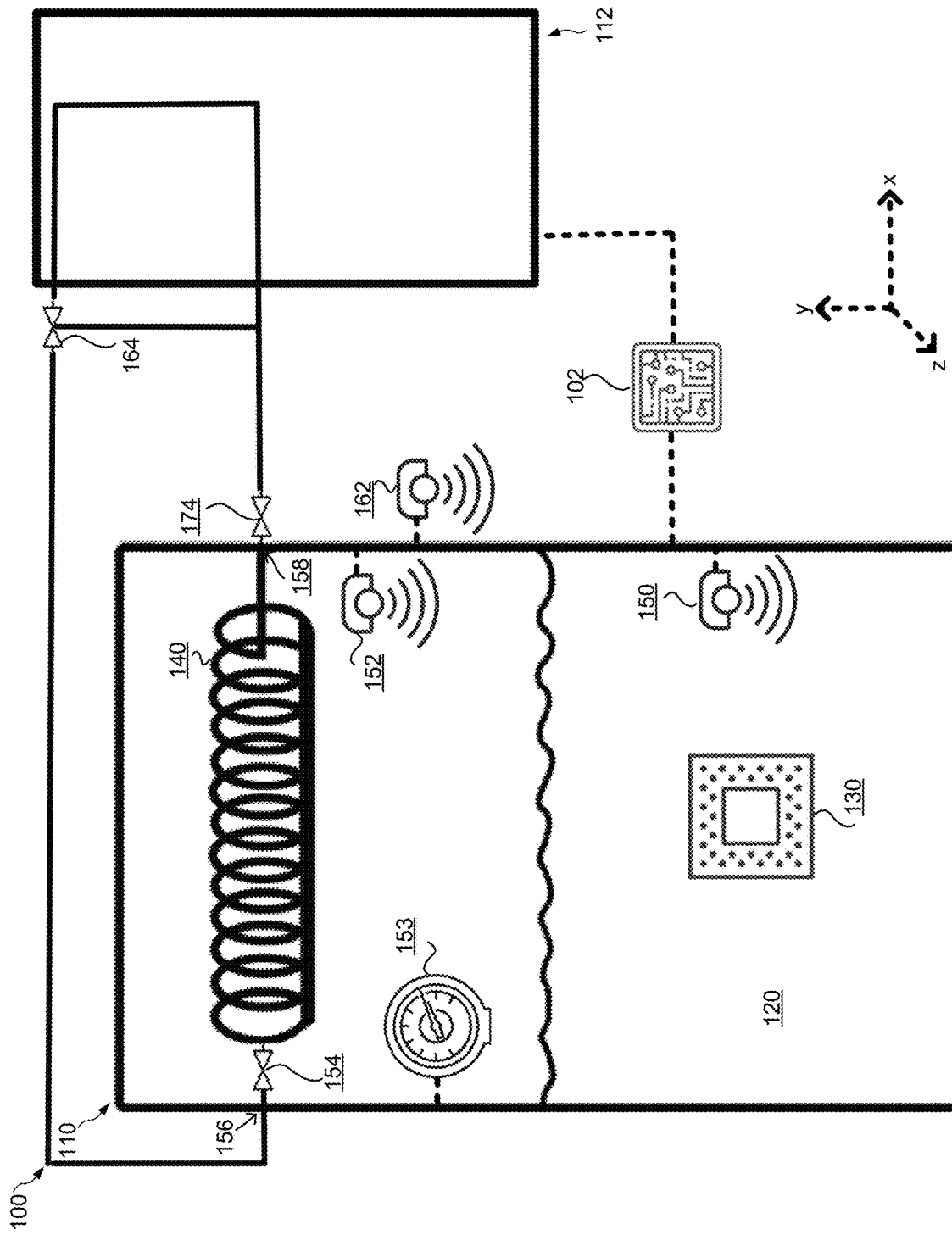

| Name of liquid cooling constituent | CAS | Molecular Formula | Boiling point | Structure |
|---|---|---|---|---|
| 1-(difluoromethoxy)-1,2,2-trifluoroethane | 60113-74-8 | C₃H₃F₅O | N/A | |
| 2-fluoromethoxy-1,1,1,2-tetrafluoroethane | 56885-27-9 | C₃H₃F₅O | N/A | |
| 2-methoxy-1,1,1,2-tetrafluoroethane | 50285-05-7 | C₃H₄F₄O | 35-36 °C | |
| 1-methoxy-1,1,2,3-tetrafluoroethane | 425-88-7 | C₃H₄F₄O | 35-36 °C | |
| 1-difluoromethoxy-2,2-difluoroethane | 32778-16-8 | C₃H₄F₄O | 55.3 °C | |
| 2-methoxy-1,1,2-trifluoroethane | 56672-49-2 | C₃H₅F₃O | N/A | |
| 1,1-difluoro-2-methoxyethane | 461-57-4 | C₃H₆F₂O | 48.5 °C | |
| 1,1,1,3,3,3-hexafluoro-2-[(fluoromethoxy)methoxy]propane | 194039-91-3 | C₅H₅F₇O₂ | N/A | |
| 1,1,2-trifluoro-1-methoxy-2(trifluoromethoxy)ethane | 996-56-5 | C₄H₄F₆O₂ | 58.2 °C | |

FIG. 1C

| | | | | |
|---|---|---|---|---|
| 1,1,1,2,3,3-hexafluoro-3-methoxypropane | 382-34-3 | $C_4H_4F_6O$ | 53 °C | |
| 1,1,1,3,3,3-hexafluoro-2-methoxypropane | 13171-18-1 | $C_4H_4F_6O$ | 50 °C | |
| 1-ethoxy-1,1,2,2-tetrafluoroethane | 512-51-6 | $C_4H_6F_4O$ | 56°C to 58°C | |
| 2-ethoxy-1,1,2,2-tetrafluoroethane | 512-51-6 | $C_4H_6F_4O$ | 56°C to 58°C | |
| 1,1,1-trifluoro-2-ethoxyethane | 461-24-5 | $C_4H_7F_3O$ | 50.3 °C | |
| 1,1,1-trifluoro-3-methoxypropane | 461-22-3 | $C_4H_7F_3O$ | 54.9 °C | |
| 1,1,1-trifluoro-2-methoxypropane | 1550-49-8 | $C_4H_7F_3$ | 11.8-12.7 °C | |
| 1-ethoxy-1,2,2-trifluoroethane | | $C_4H_7F_3$ | 11.8-12.7 °C | |
| 2,3-difluoro-4-(trifluoromethyl)oxetane | 858101-98-1 | $C_4H_3F_5O$ | | |
| 1,1,2,2,3,3-hexafluoro-3-methoxypropane | | $C_4H_3F_5O$ | | |
| (Perfluorobutyl) ethylene | 19430-93-4 | $C_6H_3F_9$ | 59-60 °C | |

FIG. 1C (Continued)

| A | B | azeotropic point composition (20Kg) Wt% (A) | azeotropic point composition (20Kg) Wt% (B) | azeotrope boiling point (°C) | Stable running time (h) |
|---|---|---|---|---|---|
| PFBE | 1-(difluoromethoxy)-1,1,2-trifluoroethane | 42.7 | 57.3 | 49.9±0.2 | 360 |
| PFBE | 2-fluoroethoxy-1,1,1,2-tetrafluoroethane | 12.3 | 87.7 | 42.8±0.2 | 360 |
| PFBE | 2-methoxy-1,1,1,2-tetrafluoroethane | 4.5 | 95.5 | 37.2±0.2 | 360 |
| PFBE | 1-methoxy-1,1,2,2-tetrafluoroethane | 7.5 | 92.5 | 37.9±0.2 | 360 |
| PFBE | 1-difluoromethoxy-2,2-difluoroethane | 52.3 | 47.7 | 49.8±0.2 | 360 |
| PFBE | 2-methoxy-1,1,2-trifluoroethane | 57.1 | 42.9 | 48.5±0.2 | 360 |
| PFBE | 1,1-difluoro-2-methoxyethane | 50.5 | 49.5 | 43.3±0.2 | 360 |
| PFBE | 1,1,1,3,3,3-hexa-2-(fluoroethoxy)propane | 42.2 | 57.8 | 57.1±0.2 | 360 |
| PFBE | 1,1,2-trifluoro-1-methoxy-2(trifluoromethoxy)ethane | 45.6 | 54.4 | 57.1±0.2 | 360 |
| PFBE | 1,1,1,2,3,3-hexafluoro-3-methoxypropane | 15.9 | 84.1 | 54.2±0.2 | 360 |
| PFBE | 1,1,1,3,3,3-hexafluoro-2-methoxypropane | 36.6 | 63.4 | 47.8±0.2 | 360 |
| PFBE | 1-ethoxy-1,1,2,2-tetrafluoroethane | 53.9 | 46.1 | 55.4±0.2 | 360 |
| PFBE | 2-ethoxy-1,1,1,2-tetrafluoroethane | 46.0 | 55.0 | 54.3±0.2 | 360 |
| PFBE | 1,1,1-trifluoro-2-ethoxyethane | 21.8 | 78.2 | 49.6±0.2 | 360 |
| PFBE | 1,1,1-trifluoro-3-methoxypropane | 46.4 | 53.6 | 52.9±0.2 | 360 |
| PFBE | 1,1,1-trifluoro-2-methoxypropane | 8.2 | 91.8 | 47.8±0.2 | 360 |
| PFBE | 1-ethoxy-1,2,2-trifluoroethane | 29.1 | 70.9 | 51.5±0.2 | 360 |
| PFBE | 2,3-difluoro-4-(trifluoromethyl)oxetane | 54.5 | 45.5 | 54.6±0.2 | 360 |

FIG. 1D

| A | B | Azeotropic composition Wt% (A) | Wt% (B) | boiling point of azeotrope (°C) | Stable running time boiling point of azeotrope |
|---|---|---|---|---|---|
| PFBE | 1-(difluoromethoxy)-1,2,2-trifluoroethane | 5 | 95 | 42.5±0.2 | 360 |
| | | 12 | 88 | 43.1±0.2 | 360 |
| | | 22 | 78 | 44.6±0.2 | 360 |
| | | 37 | 63 | 46.3±0.2 | 360 |
| | | 43 | 57 | 49.1±0.2 | 360 |
| | | 52 | 48 | 53.6±0.2 | 360 |
| PFBE | 1,1,1-trifluoro-2-ethoxyethane | 5 | 95 | 46.5±0.2 | 360 |
| | | 12 | 88 | 47.3±0.2 | 360 |
| | | 22 | 78 | 49.5±0.2 | 360 |
| | | 37 | 63 | 51.3±0.2 | 360 |
| | | 43 | 57 | 52.6±0.2 | 360 |
| | | 52 | 48 | 53.8±0.2 | 360 |
| PFBE | 1,1,2,2,3,3-hexafluoro-3-methoxypropane | 98.2 | 1.8 | 61.6+/-0.2 | Non-stable; Component 3 changes temperature 3 to 5°C |

FIG. 1E

| component A | component B | Component C | Azeotropic composition | | | Boiling point of azeotrope(C) | Stable running Time (h) |
|---|---|---|---|---|---|---|---|
| | | | Wt% (A) | Wt% (B) | Wt% (C) | | |
| PFBE | 1-(difluoromethoxy)-1,2,2-trifluoroethane | 2,3-difluoro-4-(trifluoromethyl)oxetane | 5 | 90 | 5 | 45.5± 0.2 | 360 |
| | | | 12 | 76 | 12 | 47.1± 0.2 | 360 |
| | | | 22 | 56 | 22 | 48.6± 0.2 | 360 |
| | | | 37 | 26 | 37 | 50.3± 0.2 | 360 |
| | | | 43 | 14 | 43 | 52.1± 0.2 | 360 |

FIG. 1F

|   | Component 1 | | | Component 2 | | | Component 3 | | | Component 4 | | | Component 5 | | | Component 6 | | |
|---|---|---|---|---|---|---|---|---|---|---|---|---|---|---|---|---|---|---|
|   | Before (µF) | After (µF) | Diff (%) | Before (µF) | After (µF) | Diff (%) | Before (µF) | After (µF) | Diff (%) | Before (µF) | After (µF) | Diff (%) | Before (µF) | After (µF) | Diff (%) | Before (µF) | After (µF) | Diff (%) |
| A | 49.8 | 49.4 | -0.803 | 199.6 | 199.5 | -0.050 | 199.8 | 198.8 | -0.501 | 199.9 | 199.4 | -0.250 | 199.6 | 199.7 | 0.050 | 99.9 | 99 | -0.901 |
| B | 49.7 | 47.2 | -5.030 | 199.5 | 188.6 | -5.464 | 199.7 | 191.7 | -4.006 | 199.6 | 191.8 | -3.908 | 199.8 | 189.8 | -5.005 | 99.6 | 94.6 | -5.020 |
| C | 49.7 | 47.8 | -3.823 | 199.5 | 190.5 | -4.511 | 199.8 | 192.8 | -3.504 | 199.7 | 193.7 | -3.005 | 199.8 | 191.8 | -4.004 | 99.9 | 96.9 | -3.003 |
| D | 49.6 | 47.6 | -4.032 | 199.8 | 195.8 | -2.002 | 199.8 | 195.8 | -2.002 | 199.8 | 197.8 | -1.001 | 199.7 | 195.7 | -2.003 | 99.8 | 96.8 | -3.006 |

|   | Component 7 | | | Component 8 | | | Component 9 | | | Component 10 | | | Component 11 | | | Component 12 | | |
|---|---|---|---|---|---|---|---|---|---|---|---|---|---|---|---|---|---|---|
|   | Before (µF) | After (µF) | Diff (%) | Before (µF) | After (µF) | Diff (%) | Before (µF) | After (µF) | Diff (%) | Before (µF) | After (µF) | Diff (%) | Before (µF) | After (µF) | Diff (%) | Before (µF) | After (µF) | Diff (%) |
| A | 99.7 | 99.1 | -0.602 | 99.8 | 98.9 | -0.902 | 99.9 | 99 | -0.901 | 119.9 | 119.1 | -0.667 | 119.8 | 119.1 | -0.584 | 79.8 | 79.1 | -0.877 |
| B | 99.8 | 97.8 | -2.004 | 99.8 | 94.8 | -5.010 | 99.7 | 96.7 | -3.009 | 119.9 | 115.1 | -4.003 | 119.7 | 113.7 | -5.013 | 79.8 | 75.4 | -5.514 |
| C | 99.6 | 97.6 | -2.008 | 99.6 | 95.6 | -4.016 | 99.7 | 95.7 | -4.012 | 119.8 | 115.8 | -3.339 | 119.9 | 115.1 | -4.003 | 79.7 | 77.3 | -3.011 |
| D | 99.8 | 96.8 | -3.006 | 99.7 | 96.7 | -3.009 | 99.8 | 96.8 | -3.006 | 119.8 | 119.1 | -0.584 | 119.9 | 117.5 | -2.002 | 79.9 | 77.5 | -3.004 |

A : 43% PTBE and 1-(difluoromethoxy)-1,2,2-trifluoroethane
B : Fluoroether composition
C : Fluoroolefin composition
D : Other perfluoro compound

FIG. 1G

| A | B | C | azeotropic point composition (20k/g) | | | Capacitance change |
|---|---|---|---|---|---|---|
| | | | Wt% (A) | Wt% (B) | Wt% (C) | |
| PFBE | 1-(difluoromethoxy)-1,2,2-trifluoroethane | 2,3-difluoro-4-(trifluoromethyl)oxetane | 22 | 56 | 22 | <0.8% |
| PFBE | 1-difluoromethoxy-2,2-difluoroethane | | 52.3 | 47.7 | | <0.8% |
| PFBE | 1,1,1-trifluoro-2-ethoxyethane | | 22 | 78 | | <0.8% |
| PFBE | 1,1,1-trifluoro-2-methoxypropane | | 8.2 | 91.8 | | <0.8% |
| PFBE | 1-ethoxy-1,2,2-trifluoroethane | | 29.1 | 70.9 | | <0.8% |

FIG. 1H

LIQUID COOLING WHILE PREVENTING ELECTRONIC DAMAGE

FIELD OF THE INVENTION

This disclosure relates to liquid cooling and systems to perform liquid cooling.

BACKGROUND

With the meteoric rise of computing technology, including in telecommunications such as fifth generation wireless (5G), sixth generation wireless (6G), and artificial intelligence, the need for heat dissipation of electronic components or devices has increased. Currently, efforts of cooling for electronic components or devices are plagued by damage to the electronic components or devices themselves during the liquid cooling. This damage may be manifested, for example, by dust, vibration, and/or compromised performance (e.g., decreased capacitance) of capacitors.

SUMMARY

Various implementations of the present disclosure can include a perfluoro compound comprising perfluorobutyl ethylene (PFBE) and a fluoroalkane, wherein the perfluoro compound has an azeotropic point between 40 degrees Celsius and 60 degrees Celsius, inclusive.

In some embodiments, the perfluoro compound has an azeotropic point between 45 degrees Celsius and 55 degrees Celsius, inclusive.

In some embodiments, the fluoroalkane comprises any of 1-(difluoromethoxy)-1,2,2-trifluoroethane; 2-fluoromethoxy-1,1,1,2-tetrafluoroethane; 2-methoxy-1,1,1,2-tetrafluoroethane; 1-methoxy-1,1,2,2-tetrafluoroethane; 1-difluoromethoxy-2,2-difluoroethane; 2-methoxy-1,1,2-trifluoroethane; 1,1-difluoro-2-methoxyethane; 1,1,1,3,3,3-hexafluoro-2-[(fluoromethoxy)(methoxy)]propane; 1,1,2-trifluoro-1-methoxy-2(trifluoromethoxy)ethane; 1,1,1,2,3,3-hexafluoro-3-methoxypropane; 1,1,1,3,3,3-hexafluoro-2-methoxypropane; 2-ethoxy-1,1,2,2-tetrafluoroethane ($C_4H_6F_4O$); 1-ethoxy-1,1,2,2-tetrafluoroethane ($C_4H_6F_4O$); 1,1,1-trifluoro-2-ethoxyethane; 1,1,1-trifluoro-3-methoxypropane; 1,1,1-trifluoro-2-methoxypropane; 1-ethoxy-1,2,2-trifluoroethane; 2,3-difluoro-4-(trifluoromethyl)oxetane; and/or 1,1,2,2,3,3-hexafluoro-1-methoxypropane.

In some embodiments, the fluoroalkane comprises 1-(difluoromethoxy)-1,2,2-trifluoroethane and 2,3-difluoro-4-(trifluoromethyl)oxetane.

In some embodiments, the fluoroalkane comprises between 10 percent and 60 percent by weight of 1-(difluoromethoxy)-1,2,2-trifluoroethane.

In some embodiments, the fluoroalkane comprises between 50 percent and 60 percent by weight of 1-(difluoromethoxy)-1,2,2-trifluoroethane.

In some embodiments, the fluoroalkane comprises between 20 percent and 30 percent by weight of 2,3-difluoro-4-(trifluoromethyl)oxetane.

In some embodiments, the fluoroalkane comprises between 30 percent and 40 percent by weight of 2,3-difluoro-4-(trifluoromethyl)oxetane.

In some embodiments, the fluoroalkane comprises between 40 percent and 50 percent by weight of 2,3-difluoro-4-(trifluoromethyl)oxetane.

In some embodiments, the perfluoro compound comprises between 20 percent and 30 percent by weight of the PFBE, and the fluoroalkane comprises between 50 percent and 60 percent by weight of 1-(difluoromethoxy)-1,2,2-trifluoroethane, and between 20 percent and 30 percent by weight of 2,3-difluoro-4-(trifluoromethyl)oxetane.

In some embodiments, the fluoroalkane comprises between 40 percent weight and 50 percent weight of 1-difluoromethoxy-2,2-difluoroethane.

In some embodiments, the fluoroalkane comprises between 40 percent weight and 50 percent weight of 2-methoxy-1,1,2-trifluoroethane.

In some embodiments, the fluoroalkane comprises between 45 percent weight and 55 percent weight of 1-(difluoromethoxy)-1,2,2-trifluoroethane.

In some embodiments, the fluoroalkane comprises between 80 percent weight and 90 percent weight of 1,1,1,2,3,3-hexafluoro-3-methoxypropane.

In some embodiments, the fluoroalkane comprises between 60 percent weight and 70 percent weight of 1,1,1,3,3,3-hexafluoro-2-methoxypropane.

In some embodiments, the fluoroalkane comprises between 50 percent weight and 60 percent weight of 2-ethoxy-1,1,2,2-tetrafluoroethane.

In some embodiments, the fluoroalkane comprises between 70 percent weight and 80 percent weight of 1,1,1-trifluoro-2-ethoxyethane.

In some embodiments, the fluoroalkane comprises between 50 percent weight and 60 percent weight of 1,1,1-trifluoro-3-methoxypropane.

In some embodiments, the fluoroalkane comprises between 90 percent weight and 95 percent weight of 1,1,1-trifluoro-2-methoxypropane.

In some embodiments, a method of cooling using the perfluoro compound, comprises: immersing an electronic component within the perfluoro compound in a sealed container, wherein the perfluoro compound, upon reaching an azeotropic point, is cooled by a condenser within the sealed container; measuring, using one or more temperature sensors within the sealed container, a temperature of the perfluoro compound; in response to detecting that the perfluoro compound reaches a threshold temperature, selectively controlling one or more valves associated with the condenser to open and cool fluid within the condenser.

In some embodiments, the method further comprises adjusting a vertical height of the condenser based on the temperature of the perfluoro compound.

These and other features of the cooling compounds, systems, methods, and any computing systems including non-transitory computer readable media disclosed herein, as well as the methods of operation and functions of the related elements of structure and the combination of parts, will become more apparent upon consideration of the following description and the appended claims with reference to the accompanying drawings, all of which form a part of this specification, wherein like reference numerals designate corresponding parts in the various figures. It is to be expressly understood, however, that the drawings are for purposes of illustration and description only and are not intended as a definition of the limits of the invention.

BRIEF DESCRIPTION OF THE DRAWINGS

Certain features of various embodiments of the present technology are set forth with particularity in the appended claims. A better understanding of the features and advantages of the technology will be obtained by reference to the following detailed description that sets forth illustrative embodiments, in which the principles of the invention are utilized, and the accompanying drawings. Any principles or concepts illustrated in one figure may be applicable to any other relevant figures. For example, principles illustrated in FIGS. 1A and 1B may also be applicable to any of FIGS. 1C-1H and FIG. 2, and vice versa.

FIGS. 1A and 1B illustrates an example implementation of a cooling system.

FIG. 1C describes details of different example cooling compounds that effectively cool computing components without performance degradation.

FIG. 1D illustrates further information regarding details of the aforementioned examples of the cooling compounds.

FIG. 1E illustrates cooling compounds that include different proportions of the fluorinated alkane.

FIG. 1F illustrates cooling compounds that include multiple fluorinated alkanes in different proportions.

FIG. 1G illustrates a specific test using the cooling compound 120 of 43% PFBE and 57% 1-(difluoromethoxy)-1,2,2-trifluoroethane, which facilitates superior preservation of electronic properties.

FIG. 1H illustrates testing results of different cooling compounds 120 to verify the effectiveness of the cooling compounds 120 in preserving electronic properties.

DETAILED DESCRIPTION

In some implementations, one or more cooling compounds, composites, or mixtures (hereinafter "compounds") may prevent degradation of components or devices (hereinafter "components") such as electronic components, during liquid cooling (e.g., immersion cooling). The cooling compounds may include perfluorinated compound compositions. In some implementations, the perfluorinated compound compositions may include perfluorobutyl ethylene (PFBE) and/or a fluoroalkane entity which may include a refrigerant. The cooling compounds, as part of a cooling device or system (hereinafter "system") such as an immersion cooling system, may improve heat dissipation density, while conserving energy and reducing detrimental emissions, such as carbon or greenhouse gases. At the same time, the cooling compounds have little to no detrimental performance impact on the components being cooled. In some examples, the cooling compounds may be integrated within a phase-change immersion type system.

Figure 1B:
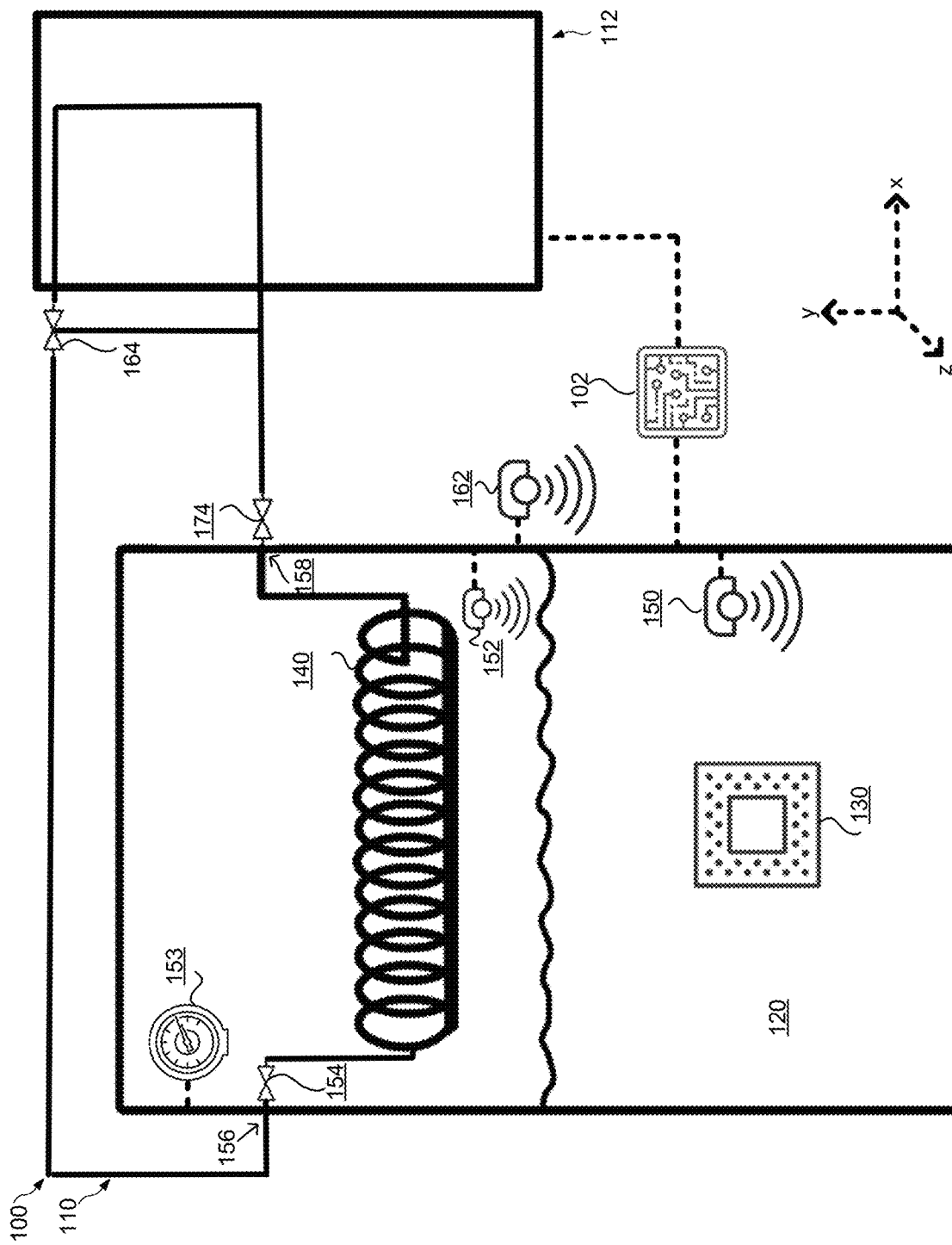

Phase-change immersion may encompass two-phase liquid cooling. In two-phase immersion liquid cooling, the heat transfer efficiency of the liquid is exponentially improved through the boiling and condensation processes of the cooling compounds. The cooling compounds may include an electronic fluorinated liquid, which may include a dielectric fluid. As illustrated in FIGS. 1A and 1B, one or more electronic equipment pieces, devices, or components (hereinafter "components") are completely immersed in the cooling compound in a container that is airtight but easy to handle (e.g., a vessel). Inside the container, the heat emitted by the electronic component is absorbed by the cooling compound. The temperature of the cooling compound rises after the cooling compound absorbs heat. The cooling compound begins to boil and changes from liquid phase to gas phase after reaching the boiling (e.g., azeotropic) point. The gas phase forms a gas phase zone above a surface of the liquid phase of the cooling compound. The gas phase contacts a heat exchanger (e.g., condenser). The condenser absorbs heat from the gas phase of the cooling compound. The cooling compound condenses from gas phase to liquid phase as its temperature decreases to below its azeotropic point, thus being recirculated back in the container. The heated liquid (e.g., water) in the condenser is replaced by cooling liquid through the circulating cooling liquid system of the condenser to complete the heat removal cycle.

FIG. 1 illustrates a cooling system 100 in which a cooling compound 120, manifested as a liquid phase, cools one or more components (e.g., an electronic component) 130. The component 130 may be immersed within the cooling compound 120, housed within a container, reservoir, or vessel (hereinafter "container") 110. The container 110 may be maintained at a given pressure, such as around 1 atmosphere. In some examples, a barrier or coating prevents the component 130 from directly or physically contacting the cooling compound 120. In some examples, the component 130 directly or physically contacts the cooling compound 120. When a temperature of the component 130 increases, heat transfers into the cooling compound 120, thereby heating the cooling compound 120. As the temperature of the cooling compound 120 increases to its azeotropic point, the cooling compound 120 changes into a gaseous phase. A condenser 140 may transform the gaseous phase of the cooling compound 120 back into the liquid phase so that the cooling compound 120 is recycled, as the cooling compound 120 approaches or contacts the condenser 140. The condenser 140 may cool the cooling compound 120 to at or near its original (e.g., unheated) temperature. In some examples, the condenser 140 includes a fluid such as water. As the condenser 140 cools the cooling compound 120, the heat removed from the cooling compound 120 is transferred to the fluid in the condenser 140, thereby causing the fluid to increase in temperature. When the fluid increases in temperature to above a threshold temperature, the fluid within the condenser 140 may flow, via an outlet 156, to a container, reservoir, vessel, or system (hereinafter "system") 112 to be cooled and transported back to the container 110 via an inlet 158. In some examples, this aforementioned threshold temperature may be adjusted based on a clocking speed and/or load consumed by of the component 130. The clocking speed and/or load may be measured in absolute terms or relative terms (e.g., based on a maximum or a standard value specific to the component 130) For example, a higher the clocking speed and/or the load consumed, a lower the threshold temperature in order to prompt earlier cooling of the fluid, which causes the cooling compound 120 to be cooled earlier and/or faster and also results in earlier and/or faster cooling of the component 130. The cooling compound 120 remains in the container 110. In some examples, the cooling system 100 may include one or more sensors, such as an internal temperature sensor 150, one or more other sensors 152, an external temperature sensor 162, and/or a pressure sensor 153. The internal temperature sensor 150 may monitor a temperature of the cooling compound 120 and/or within the container 110. If the temperature of the cooling compound 120 is at or near a particular threshold temperature, as detected by the internal temperature sensor 150, a controller 102 of the cooling system 100 may open a valve 154 at the outlet 156 so that the fluid within the condenser 140 is transmitted to the either the system 112 or somewhere external to the container 100 to be cooled. The particular threshold temperature, in some examples, may be adjusted based on a clocking speed and/or a load consumed by the component 130 (e.g., by the controller 102). At the system 112, the fluid within the condenser 140 is cooled and returned back to the container 110. In some examples, if an external temperature or a temperature of an external environment is sufficiently low (e.g., below a threshold temperature), as determined by the external temperature sensor 162, the fluid within the condenser 140 may not be directed to the system 112 but instead, may be cooled externally and/or by a different system. Instead, a valve 164 may either direct the fluid into the system 112 or away from the system 112. The valve 164 may be controlled by the controller 102. The fluid, once cooled, may be returned to the condenser 140.

In some examples, as illustrated in FIG. 1B, the condenser 140 may be vertically movable (e.g., along a y-axis), for example, depending on a temperature of the cooling compound 120. For example, the condenser 140 may be moved downwards (e.g., closer to the cooling compound 120) if the temperature of the cooling compound 120 increases, to become closer to the cooling compound 120 and/or for faster cooling.

The cooling compound 120 exhibits beneficial attributes such as heat conductivity, chemical and thermal stability, corrosion resistance, non-toxicity, environmental friendliness, a narrow boiling range, a high latent heat of vaporization, and intersolubility. The cooling compound 120 may be characterized by an absence of reactive functional groups such as nucleophilic groups and labile functional groups. The cooling compound 120 may also be non-oil based. In some implementations, the cooling compound 120 includes a liquid cooling perfluoro compound composition, which may include PFBE and a fluoroalkane. Regarding the fluoroalkane, a number of carbons of the alkane is between two and eight, inclusive. In some implementations, the number of carbons of the alkane is between two and five, inclusive, or between two and four, inclusive. In some implementations, the number of carbons of the alkane may be within any subrange of the aforementioned ranges. In some implementations, the fluorinated alkane includes a short-chain fluorinated alkane. In some implementations, the main chain of the fluorinated alkane includes oxygen atoms. In some implementations, the fluorinated alkane includes a fluoroether.

In some examples, as detailed in FIG. 1C, the cooling compound 120 includes PFBE and a fluoroalkane. The fluorinated alkane or fluoroalkane includes one or more of the following compounds: 1-(difluoromethoxy)-1,2,2-trifluoroethane; 2-fluoromethoxy-1,1,1,2-tetrafluoroethane; 2-methoxy-1,1,1,2-tetrafluoroethane; 1-methoxy-1,1,2,2-tetrafluoroethane; 1-difluoromethoxy-2,2-difluoroethane; 2-methoxy-1,1,2-trifluoroethane; 1,1-difluoro-2-methoxyethane; 1,1,1,3,3,3-hexafluoro-2-[(fluoromethoxy)(methoxy)]propane; 1,1,2-trifluoro-1-methoxy-2(trifluoromethoxy)ethane; 1,1,1,2,3,3-hexafluoro-3-methoxypropane; 1,1,1,3,3,3-hexafluoro-2-methoxypropane; 2-ethoxy-1,1,2,2-tetrafluoroethane ($C_4H_6F_4O$); 1-ethoxy-1,1,2,2-tetrafluoroethane ($C_4H_6F_4O$); 1,1,1-trifluoro-2-ethoxyethane; 1,1,1-trifluoro-3-methoxypropane; 1,1,1-trifluoro-2-methoxypropane; 1-ethoxy-1,2,2-trifluoroethane; 2,3-difluoro-4-(trifluoromethyl)oxetane; and/or 1,1,2,2,3,3-hexafluoro-1-methoxypropane.

Each of the aforementioned fluoroalkanes may be combined with PFBE to form an azeotrope, which boils at an azeotropic point. An azeotrope refers to a mixture of two or more entities such as solutions (e.g., homogenous solutions) of different constituents, components or entities (hereinafter "constituents") being mixed in a specific ratio and having a single boiling point under a given pressure. Here, again, the mixture may include PFBE and a fluorinated alkane. At the azeotropic point of the mixture, the composition of gaseous portion of the mixture is in equilibrium with, and is the same as, the liquid portion of the mixture. The azeotropic points of some mixtures are lower than the boiling points of each of the individual constituents. One reason is that intermolecular forces between the different constituents when mixed together are weaker compared to intermolecular forces of each constituent when separate. Here, in some implementations, the azeotropic point of the cooling compound 120 is between 40 to 60 degrees Celsius, inclusive, between 45 and 55 degrees Celsius, inclusive, or within any subrange of the aforementioned ranges. Such ranges of the azeotropic point of the cooling compound 120 result in most efficient and effective cooling of the component 130.

One reason is that when the component 130 increases in temperature, the cooling compound 120 cools the component 130, which causes the cooling compound to increase in temperature. Once the cooling compound 120 increases in temperature to reach or exceed the azeotropic point, at least a portion of the cooling compound 120 boils to form a gaseous phase. The cooling compound 120 in its gaseous phase is converted, via the condenser 140, back to liquid phase, thereby recycling the cooling compound 120 for subsequent cooling cycles.

Application of and/or treatment using the cooling compound 120 may maintain a stable operation of the component 130 for a period of time if the cooling compound 120 satisfies certain properties such as having an azeotropic point within the aforementioned range of temperatures. Here, a stable operation may be defined as a temperature of the component 130 remaining within a two degrees Celsius range of temperatures during operation under a fixed pressure (e.g., pressure remains within a narrow threshold range such as approximately 1 atmosphere). That means the temperature of the component 130 does not deviate from the two degrees Celsius range of temperatures.

The cooling compound 120 having an azeotropic point within a range of 40 to 60 degrees Celsius, inclusive, maintains a stable operation of the electronic component during an example test duration of 360 hours. Meanwhile, the cooling compound 120 having an azeotropic point within a range of 45 to 55 degrees Celsius, inclusive, maintains a stable operation of the component 130 during an example test duration of 360 hours, even with 20% overclocking of the component 130. Therefore, such a cooling compound 120 supports heavy duty and heavy load computing cycles of the component 130 without deterioration or overheating, thus increasing performance of the component 130.

Nonlimiting examples of cooling compounds having the aforementioned azeotropic point within a range of 45 to 55 degrees Celsius, inclusive, are listed below and also shown in the FIGS. 1C-1H. For example, such cooling compounds include a fluoroalkane that comprises 1-(difluoromethoxy)-1,2,2-trifluoroethane and 2,3-difluoro-4-(trifluoromethyl)oxetane. In some embodiments, the fluoroalkane comprises between 10 percent and 60 percent by weight of 1-(difluoromethoxy)-1,2,2-trifluoroethane. In some embodiments, the fluoroalkane comprises between 50 percent and 60 percent by weight of 1-(difluoromethoxy)-1,2,2-trifluoroethane. In some embodiments, the fluoroalkane comprises between 20 percent and 30 percent by weight of 2,3-difluoro-4-(trifluoromethyl)oxetane. In some embodiments, the fluoroalkane comprises between 30 percent and 40 percent by weight of 2,3-difluoro-4-(trifluoromethyl)oxetane. In some embodiments, the fluoroalkane comprises between 40 percent and 50 percent by weight of 2,3-difluoro-4-(trifluoromethyl)oxetane. In some embodiments, the perfluoro compound comprises between 20 percent and 30 percent by weight of the PFBE, and the fluoroalkane comprises between 50 percent and 60 percent by weight of 1-(difluoromethoxy)-1,2,2-trifluoroethane, and between 20 percent and 30 percent by weight of 2,3-difluoro-4-(trifluoromethyl)oxetane. In some embodiments, the fluoroalkane comprises between 40 percent weight and 50 percent weight of 1-difluoromethoxy-2,2-difluoroethane. In some embodiments, the fluoroalkane comprises between 40 percent weight and 50 percent weight of 2-methoxy-1,1,2-trifluoroethane. In some embodiments, the fluoroalkane comprises between 45 percent weight and 55 percent weight of 1-(difluoromethoxy)-1,2,2-trifluoroethane. In some embodiments, the fluoroalkane comprises between 80 percent weight and 90 percent weight of 1,1,1,2,3,3-hexafluoro-3-methoxypropane. In some embodiments, the fluoroalkane comprises between 60 percent weight and 70 percent weight of 1,1,1,3,3,3-hexafluoro-2-methoxypropane. In some embodiments, the fluoroalkane comprises between 50 percent weight and 60 percent weight of 2-ethoxy-1,1,2,2-tetrafluoroethane. In some embodiments, the fluoroalkane comprises between 70 percent weight and 80 percent weight of 1,1,1-trifluoro-2-ethoxyethane. In some embodiments, the fluoroalkane comprises between 50 percent weight and 60 percent weight of 1,1,1-trifluoro-3-methoxypropane. In some embodiments, the fluoroalkane comprises between 90 percent weight and 95 percent weight of 1,1,1-trifluoro-2-methoxypropane. In some embodiments, the fluoroalkane comprises between 70 percent weight and 80 percent weight, or between 70 percent weight and 75 percent weight of 1-ethoxy-1,2,2-trifluoroethane. In some embodiments, the fluoroalkane comprises between 40 percent weight and 50 percent weight of 3-difluoro-4-(trifluoromethyl)oxetane.

If an azeotropic point is outside the range of 45 to 55 degrees Celsius, stable operation of the component 130 may be infeasible with 20% overclocking of the component 130. Thus, if an azeotropic point is outside the range of 45 to 55 degrees Celsius, stable operation of the component 130 may be feasible, in some circumstances, with 10% overclocking of the component 130. Meanwhile, other cooling compounds, such as those having azeotropic points outside of the range of 40 to 60 degrees Celsius, are unable to facilitate or provide stable operation of the component 130 during cooling. Therefore, the ranges of azeotropic points of the mixture being between 40 and 60 degrees Celsius, inclusive, between 45 and 55 degrees Celsius, inclusive, or any subrange thereof, constitute critical ranges to facilitate stable operation of the component 130 over a period of time by effectively cooling the component 130 without degradation or deterioration of the electronic components. FIG. 1D illustrates further information regarding details of the aforementioned examples of the cooling compound 120, including different proportions of each constituent of the cooling compound 120 that satisfy stable operation of the component 130. For example, as illustrated in FIG. 1D, a cooling compound including 42.7 percent weight of PFBE and 57.3 percent weight of 1-(difluoromethoxy)-1,2,2-trifluoroethane has an azeotropic point of about 49.9 degrees Celsius. A cooling compound including 12.3 percent weight of PFBE and 87.7 percent weight of 1-(difluoromethoxy)-1,2,2-trifluoroethane has an azeotropic point of about 42.8 degrees Celsius.

In some examples, as illustrated in FIG. 1E, other cooling compounds 120 that include different proportions of the fluorinated alkane are shown. These cooling compounds 120 were also verified to maintain stable operation (e.g., cooling behaviors) of the component 130. For example, in FIG. 1E, a cooling compound including 5 percent weight of PFBE and 95 percent weight of 1-(difluoromethoxy)-1,2,2-trifluoroethane has an azeotropic point of about 42.5 degrees Celsius. A cooling compound including 12 percent weight of PFBE and 88 percent weight of 1-(difluoromethoxy)-1,2,2-trifluoroethane has an azeotropic point of about 43.1 degrees Celsius. A cooling compound including 52 percent weight of PFBE and 48 percent weight of 1, 1, 1-trifluoro-2-ethoxyethane has an azeotropic point of about 53.8 degrees Celsius.

In some examples, as illustrated in FIG. 1F, other cooling compounds 120 that include multiple fluorinated alkanes in different proportions are shown. These cooling compounds 120 were also verified to maintain stable operation of the component 130. For example, a cooling compound including 12 percent weight of PFBE, 76 percent weight of 1-(difluoromethoxy)-1,2,2-trifluoroethane, and 12 percent weight of 2,3-difluoro-4-(trifluoromethyl)oxetane has an azeotropic point of about 47.1 degrees Celsius.

The efficacy of the aforementioned cooling compounds 120 within the FIGS. 1D-1F, and 4 have been further verified, as well as other combinations of cooling compounds 120 shown in FIG. 1C, such that a corresponding performance decay (e.g., capacitance decrease) of the component 130 is under one percent. The testing was performed, in one instance, with a server motherboard as the component 130, which was sealed for one year, as shown in FIG. 1G. Meanwhile, testing using other cooling compounds resulted in greater performance decays. These other cooling compounds include, without limitation, fluoroether compositions or fluoroolefin compositions.

FIG. 1G illustrates a specific test using the cooling compound 120 of 43% PFBE and 57% 1-(difluoromethoxy)-1,2,2-trifluoroethane, which facilitates superior preservation of electronic properties. Twelve different components, some of which have different original capacitances, were separately tested and compared by application of the aforementioned cooling compound 120, versus other cooling compounds. For all the components tested, application of the cooling compound 120 of 43% PFBE and 1-(difluoromethoxy)-1,2,2-trifluoroethane resulted in a capacitance decrease of under one percent, while application of other cooling compounds, including fluoroether compositions or fluoroolefin compositions, resulted in higher capacitance decrease, which signifies higher performance loss.

FIG. 1H illustrates testing results of different cooling compounds 120 to verify the effectiveness of the cooling compounds 120 in preserving electronic properties. Components were tested for between three and six months, with application of each of the different cooling compounds 120 separately. The components exhibited a performance degradation (e.g., a capacitance change) of less than 0.8 percent, for all of the different cooling compounds 120. For example, a cooling compound including 22 percent PFBE, 56 percent 1-(difluoromethoxy)-1,2,2-trifluoroethane, and 22 percent 2,3-difluoro-4-(trifluoromethyl)oxetane, when tested on a component, results in a capacitance change of less than 0.8 percent during an example test period of between 3 and 6 months. Thus, the cooling compounds 120 illustrated in FIG. 1H facilitates superior preservation of electronic properties.

Figure 2:
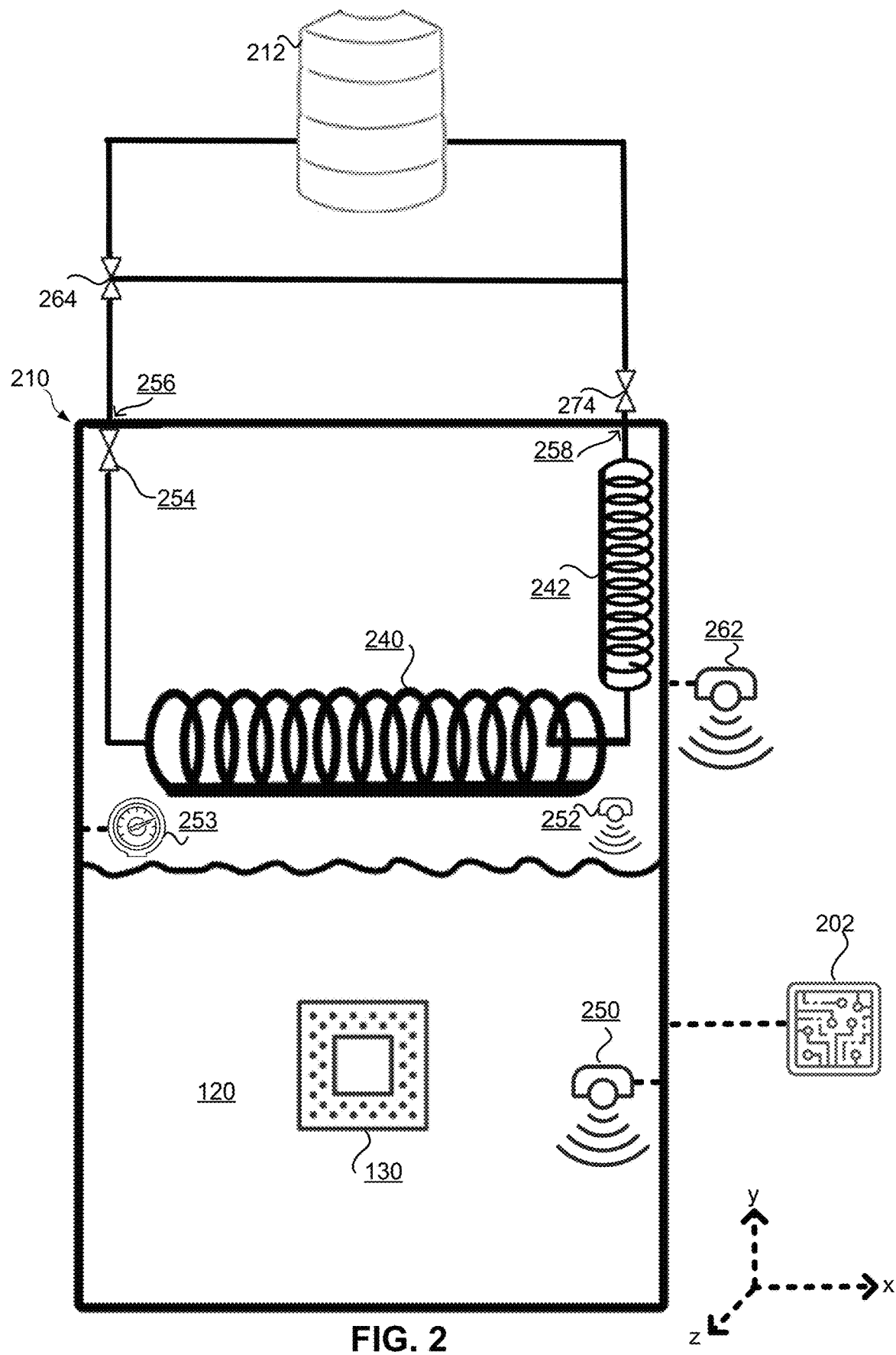
FIG. 2 illustrates an alternative cooling system.

FIG. 2 illustrates an alternative cooling system. In FIG. 2, a countercurrent heat exchange principle is illustrated. Any relevant principles from any of the aforementioned FIGS. 1A, 1B, and/or FIGS. 1C-1H may be applicable to FIG. 2. For example, as the cooling compound 120 boils, the gaseous phase rises (e.g., along a y-axis). Meanwhile, fluid from a condenser 242 may move downwards (e.g., along the y-axis) opposite in direction of the gaseous phase of the cooling compound 120. In FIG. 2, an internal temperature sensor 250 may be implemented as, or similar to, the internal temperature sensor 150. One or more other sensors 252 may be implemented as the one or more other sensors 152. An external temperature sensor 262 may be implemented as the external temperature sensor 162. A pressure sensor 253 may be implemented as the pressure sensor 153. The internal temperature sensor 250 may monitor a temperature of the cooling compound 120 and/or within a container 210. If the temperature of the cooling compound 120 is at or near a particular threshold temperature, as detected by the internal temperature sensor 250, a controller 202 of the cooling system may open a valve 254 at an outlet 256, and/or open a valve 274 at an inlet 258, so that the fluid within a condenser 240 and/or within a condenser 242, may be transmitted to the either the system 112 or somewhere external to the container 100 to be cooled. Thus, cool fluid may enter into the container 210 via the valve 274, and/or warm fluid may exit from the container 210, via the valve 254. A valve 264 may control whether the fluid with the condenser 240 and/or within the condenser 242 enters into a system 212 for cooling, or whether the fluid is to be directed away from the system 212. In some examples, if an external temperature or a temperature of an external environment is sufficiently low (e.g., below a threshold temperature), as determined by the external temperature sensor 262, the fluid within the condenser 240 and/or the condenser 242 may not be directed to the system 212 but instead, may be cooled externally and/or by a different system. The valve 164 may be controlled by the controller 202. The fluid, once cooled, may be returned to the condenser 242 and/or 240.

The various features and processes described above may be used independently of one another, or may be combined in various ways. All possible combinations and sub-combinations are intended to fall within the scope of this disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed example embodiments. The example systems and components described herein may be configured differently than described. For example, elements may be added to, removed from, or rearranged compared to the disclosed example embodiments.

Conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment. Any reference to "approximately" or "about" may be construed to mean, within a range of +/−20 percent, +/−10 percent, +/−5 percent, +/−1 percent, +/−0.5 percent, or any other suitable value.

It should be emphasized that many variations and modifications may be made to the above-described embodiments, the elements of which are to be understood as being among other acceptable examples. All such modifications and variations are intended to be included herein within the scope of this disclosure. The foregoing description details certain embodiments of the invention. It will be appreciated, however, that no matter how detailed the foregoing appears in text, the invention can be practiced in many ways. As is also stated above, it should be noted that the use of particular terminology when describing certain features or aspects of the invention should not be taken to imply that the terminology is being re-defined herein to be restricted to including any specific characteristics of the features or aspects of the invention with which that terminology is associated. The scope of the invention should therefore be construed in accordance with the appended claims and any equivalents thereof.

Language

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the subject matter has been described with reference to specific example embodiments, various modifications and changes may be made to these embodiments without departing from the broader scope of embodiments of the present disclosure. Such embodiments of the subject matter may be referred to herein, individually or collectively, by the term "invention" merely for convenience and without intending to voluntarily limit the scope of this application to any single disclosure or concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The specification and drawings are, accordingly, to be regarded in an illustrative rather than a restrictive sense.

Although the invention has been described in detail for the purpose of illustration based on what is currently considered to be the most practical and preferred implementations, it is to be understood that such detail is solely for that purpose and that the invention is not limited to the disclosed implementations, but, on the contrary, is intended to cover modifications and equivalent arrangements that are within the spirit and scope of the appended claims. For example, it is to be understood that the present invention contemplates that, to the extent possible, one or more features of any figure or example can be combined with one or more features of any other figure or example. A component being implemented as another component may be construed as the component being operated in a same or similar manner as the another component, and/or comprising same or similar features, characteristics, and parameters as the another component.

The phrases "at least one of," "at least one selected from the group of," or "at least one selected from the group consisting of," and the like are to be interpreted in the disjunctive (e.g., not to be interpreted as at least one of A and at least one of B).

Reference throughout this specification to an "example" or "examples" means that a particular feature, structure or characteristic described in connection with the example is included in at least one example of the present invention. Thus, the appearances of the phrases "in one example" or "in some examples" in various places throughout this specification are not necessarily all referring to the same examples, but may be in some instances. Furthermore, the particular features, structures, or characteristics may be combined in any suitable manner in one or more different examples.

The controller 102 and/or 202 may include one or more hardware (e.g., physical) and/or virtual (e.g., cloud) processors, and/or software. The controller 102 and/or 202 may be configured to coordinate and/or perform operations of the cooling system 100. The processors may further be connected to, include, or be embedded with logic which, for example, may include, store, and/or encapsulate instructions to be performed. In general, the logic may be implemented, in whole or in part, as software that is capable of running, and the instructions may be read and/or executed, for example from machine-readable storage media. The logic may include, as nonlimiting examples, parameters, expressions, protocols, evaluations, conditions, and/or code. Here, the controller 102 and/or 202 may carry out execution of opening and/or closing valves, and/or performing other adjustments within any of the systems illustrated in FIGS. 1A, 1B, and 2. The techniques described herein are implemented by one or more special-purpose computing devices. The special-purpose computing devices may be hard-wired to perform the techniques, or may include circuitry or digital electronic devices such as one or more application-specific integrated circuits (ASICs) or field programmable gate arrays (FPGAs) that are persistently programmed to perform the techniques, or may include one or more hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, server computer systems, portable computer systems, handheld devices, networking devices or any other device or combination of devices that incorporate hard-wired and/or program logic to implement the techniques.

Computing device(s) are generally controlled and coordinated by operating system software. Operating systems control and schedule computer processes for execution, perform memory management, provide file system, networking, I/O services, and provide a user interface functionality, such as a graphical user interface ("GUI"), among other things.

Figure 3:
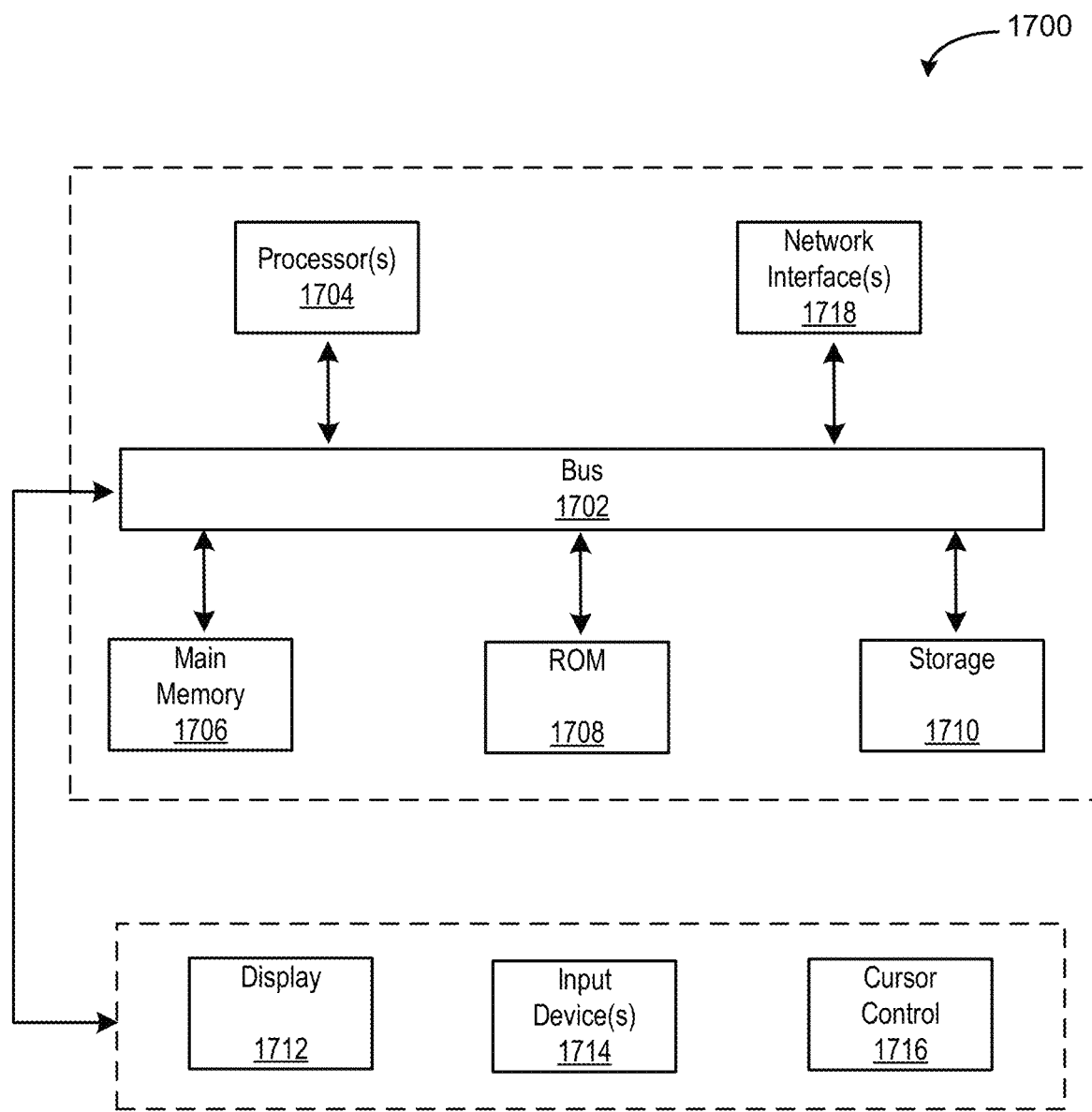
FIG. 3 illustrates an example computing system, which may be implemented in conjunction with FIGS. 1A, 1B, and 2.

FIG. 3 is a block diagram that illustrates a computer system 1700 upon which any of the embodiments (e.g., as part of the controller 102 and/or 202) described herein may be implemented. In some examples, the computer system 1700 may include a cloud-based or remote computing system. For example, the computer system 1700 may include a cluster of machines orchestrated as a parallel processing infrastructure. The computer system 1700 includes a bus 1702 or other communication mechanism for communicating information, one or more hardware processors 1704 coupled with bus 1702 for processing information. Hardware processor(s) 1704 may be, for example, one or more general purpose microprocessors.

The computer system 1700 also includes a main memory 1706, such as a random access memory (RAM), cache and/or other dynamic storage devices, coupled to bus 1702 for storing information and instructions to be executed by processor 1704. Main memory 1706 also may be used for storing temporary variables or other intermediate information during execution of instructions to be executed by processor 1704. Such instructions, when stored in storage media accessible to processor 1704, render computer system 1700 into a special-purpose machine that is customized to perform the operations specified in the instructions.

The computer system 1700 further includes a read only memory (ROM) 1708 or other static storage device coupled to bus 1702 for storing static information and instructions for processor 1704. A storage device 1710, such as a magnetic disk, optical disk, or USB thumb drive (Flash drive), etc., is provided and coupled to bus 1702 for storing information and instructions.

The computer system 1700 may be coupled via bus 1702 to a display 1712, such as a cathode ray tube (CRT) or LCD display (or touch screen), for displaying information to a computer user. An input device 1714, including alphanumeric and other keys, is coupled to bus 1702 for communicating information and command selections to processor 1704. Another type of user input device is cursor control 1716, such as a mouse, a trackball, or cursor direction keys for communicating direction information and command selections to processor 1704 and for controlling cursor movement on display 1712. This input device typically has two degrees of freedom in two axes, a first axis (e.g., x) and a second axis (e.g., y), that allows the device to specify positions in a plane. In some embodiments, the same direction information and command selections as cursor control may be implemented via receiving touches on a touch screen without a cursor.

The computing system 1700 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "module," as used herein, refers to logic embodied in hardware or firmware, or to a collection of software instructions, possibly having entry and exit points, written in a programming language, such as, for example, Java, C or C++. A software module may be compiled and linked into an executable program, installed in a dynamic link library, or may be written in an interpreted programming language such as, for example, BASIC, Perl, or Python. It will be appreciated that software modules may be callable from other modules or from themselves, and/or may be invoked in response to detected events or interrupts. Software modules configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware modules may be comprised of connected logic units, such as gates and flip-flops, and/or may be comprised of programmable units, such as programmable gate arrays or processors. The modules or computing device functionality described herein are preferably implemented as software modules, but may be represented in hardware or firmware. Generally, the modules described herein refer to logical modules that may be combined with other modules or divided into sub-modules despite their physical organization or storage.

The computer system 1700 may implement the techniques described herein using customized hard-wired logic, one or more ASICs or FPGAs, firmware and/or program logic which in combination with the computer system causes or programs computer system 1700 to be a special-purpose machine. According to one embodiment, the techniques herein are performed by computer system 1700 in response to processor(s) 1704 executing one or more sequences of one or more instructions contained in main memory 1706. Such instructions may be read into main memory 1706 from another storage medium, such as storage device 1710. Execution of the sequences of instructions contained in main memory 1706 causes processor(s) 1704 to perform the process steps described herein. In alternative embodiments, hard-wired circuitry may be used in place of or in combination with software instructions.

The term "non-transitory media," and similar terms, as used herein refers to any media that store data and/or instructions that cause a machine to operate in a specific fashion. Such non-transitory media may comprise non-volatile media and/or volatile media. Non-volatile media includes, for example, optical or magnetic disks, such as storage device 1710. Volatile media includes dynamic memory, such as main memory 1706. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Non-transitory media is distinct from but may be used in conjunction with transmission media. Transmission media participates in transferring information between non-transitory media. For example, transmission media includes coaxial cables, copper wire and fiber optics, including the wires that comprise bus 1702. Transmission media can also take the form of acoustic or light waves, such as those generated during radio-wave and infra-red data communications.

Various forms of media may be involved in carrying one or more sequences of one or more instructions to processor 1704 for execution. For example, the instructions may initially be carried on a magnetic disk or solid state drive of a remote computer. The remote computer can load the instructions into its dynamic memory and send the instructions over a telephone line using a modem. A modem local to computer system 1700 can receive the data on the telephone line and use an infra-red transmitter to convert the data to an infra-red signal. An infra-red detector can receive the data carried in the infra-red signal and appropriate circuitry can place the data on bus 1702. Bus 1702 carries the data to main memory 1706, from which processor 1704 retrieves and executes the instructions. The instructions received by main memory 1706 may retrieves and executes the instructions. The instructions received by main memory 1706 may optionally be stored on storage device 1710 either before or after execution by processor 1704.

The computer system 1700 also includes a communication interface 1718 coupled to bus 1702. Communication interface 1718 provides a two-way data communication coupling to one or more network links that are connected to one or more local networks. For example, communication interface 1718 may be an integrated services digital network (ISDN) card, cable modem, satellite modem, or a modem to provide a data communication connection to a corresponding type of telephone line. As another example, communication interface 1718 may be a local area network (LAN) card to provide a data communication connection to a compatible LAN (or WAN component to communicated with a WAN). Wireless links may also be implemented. In any such implementation, communication interface 1718 sends and receives electrical, electromagnetic or optical signals that carry digital data streams representing various types of information.

A network link typically provides data communication through one or more networks to other data devices. For example, a network link may provide a connection through local network to a host computer or to data equipment operated by an Internet Service Provider (ISP). The ISP in turn provides data communication services through the world wide packet data communication network now commonly referred to as the "Internet". Local network and Internet both use electrical, electromagnetic or optical signals that carry digital data streams. The signals through the various networks and the signals on network link and through communication interface 1718, which carry the digital data to and from computer system 1700, are example forms of transmission media.

The computer system 1700 can send messages and receive data, including program code, through the network(s), network link and communication interface 1718. In the Internet example, a server might transmit a requested code for an application program through the Internet, the ISP, the local network and the communication interface 1718.

The received code may be executed by processor 1704 as it is received, and/or stored in storage device 1710, or other non-volatile storage for later execution.

Each of the processes, methods, and algorithms described in the preceding sections may be embodied in, and fully or partially automated by, code modules executed by one or more computer systems or computer processors comprising computer hardware. The processes and algorithms may be implemented partially or wholly in application-specific circuitry.

The invention claimed is:

1. A perfluoro compound comprising perfluorobutyl ethylene (PFBE) and a fluoroalkane, wherein the perfluoro compound has an azeotropic point between 40 degrees Celsius and 60 degrees Celsius, inclusive.

2. The perfluoro compound of claim 1, wherein the perfluoro compound has an azeotropic point between 45 degrees Celsius and 55 degrees Celsius, inclusive.

3. The perfluoro compound of claim 1, wherein the fluoroalkane comprises any of 1-(difluoromethoxy)-1,2,2- trifluoroethane; 2-fluoromethoxy-1,1,1,2-tetrafluoroethane; 2-methoxy-1,1,1,2-tetrafluoroethane; 1-methoxy-1,1,2,2-tetrafluoroethane; 1-difluoromethoxy-2,2-difluoroethane; 2-methoxy-1,1,2-trifluoroethane; 1,1-difluoro-2-methoxyethane; 1,1,1,3,3,3-hexafluoro-2-[(fluoromethoxy)(methoxy)]propane; 1,1,2-trifluoro-1-methoxy-2(trifluoromethoxy)ethane; 1,1,1,2,3,3-hexafluoro-3-methoxypropane; 1,1,1,3,3,3-hexafluoro-2-methoxypropane; 2-ethoxy-1,1,2,2-tetrafluoroethane ($C_4H_6F_4O$); 1-ethoxy-1,1,2,2-tetrafluoroethane ($C_4H_6F_4O$); 1,1,1-trifluoro-2-ethoxyethane; 1,1,1-trifluoro-3-methoxypropane; 1,1,1-trifluoro-2-methoxypropane; 1-ethoxy-1,2,2-trifluoroethane; 2,3-difluoro-4-(trifluoromethyl)oxetane; and/or 1,1,2,2,3,3-hexafluoro-1-methoxypropane.

4. The perfluoro compound of claim 1, wherein the fluoroalkane comprises 1-(difluoromethoxy)-1,2,2-trifluoroethane and 2,3-difluoro-4-(trifluoromethyl)oxetane.

5. The perfluoro compound of claim 1, wherein the fluoroalkane comprises between 10 percent and 60 percent by weight of 1-(difluoromethoxy)-1,2,2-trifluoroethane.

6. The perfluoro compound of claim 1, wherein the fluoroalkane comprises between 50 percent and 60 percent by weight of 1-(difluoromethoxy)-1,2,2-trifluoroethane.

7. The perfluoro compound of claim 1, wherein the fluoroalkane comprises between 20 percent and 30 percent by weight of 2,3-difluoro-4-(trifluoromethyl)oxetane.

8. The perfluoro compound of claim 1, wherein the fluoroalkane comprises between 30 percent and 40 percent by weight of 2,3-difluoro-4-(trifluoromethyl)oxetane.

9. The perfluoro compound of claim 1, wherein the fluoroalkane comprises between 40 percent and 50 percent by weight of 2,3-difluoro-4-(trifluoromethyl)oxetane.

10. The perfluoro compound of claim 1, wherein the perfluoro compound comprises between 20 percent and 30 percent by weight of the PFBE, and the fluoroalkane comprises between 50 percent and 60 percent by weight of 1-(difluoromethoxy)-1,2,2-trifluoroethane, and between 20 percent and 30 percent by weight of 2,3-difluoro-4-(trifluoromethyl)oxetane.

11. The perfluoro compound of claim 1, wherein the fluoroalkane comprises between 40 percent weight and 50 percent weight of 1-difluoromethoxy-2,2-difluoroethane.

12. The perfluoro compound of claim 1, wherein the fluoroalkane comprises between 40 percent weight and 50 percent weight of 2-methoxy-1,1,2-trifluoroethane.

13. The perfluoro compound of claim 1, wherein the fluoroalkane comprises between 45 percent weight and 55 percent weight of 1-(difluoromethoxy)-1,2,2-trifluoroethane.

14. The perfluoro compound of claim 1, wherein the fluoroalkane comprises between 80 percent weight and 90 percent weight of 1,1,1,2,3,3-hexafluoro-3-methoxypropane.

15. The perfluoro compound of claim 1, wherein the fluoroalkane comprises between 60 percent weight and 70 percent weight of 1,1,1,3,3,3-hexafluoro-2-methoxypropane.

16. The perfluoro compound of claim 1, wherein the fluoroalkane comprises between 50 percent weight and 60 percent weight of 2-ethoxy-1,1,2,2-tetrafluoroethane.

17. The perfluoro compound of claim 1, wherein the fluoroalkane comprises between 70 percent weight and 80 percent weight of 1,1,1-trifluoro-2-ethoxyethane.

18. The perfluoro compound of claim 1, wherein the fluoroalkane comprises between 50 percent weight and 60 percent weight of 1,1,1-trifluoro-3-methoxypropane.

19. The perfluoro compound of claim 1, wherein the fluoroalkane comprises between 90 percent weight and 95 percent weight of 1,1,1-trifluoro-2-methoxypropane.

20. A method of cooling using the perfluoro compound of claim 1, wherein the method comprises:
- immersing an electronic component within the perfluoro compound in a sealed container, wherein the perfluoro compound, upon reaching an azeotropic point, is cooled by a condenser within the sealed container;
- measuring, using one or more temperature sensors within the sealed container, a temperature of the perfluoro compound;
- in response to detecting that the perfluoro compound reaches a threshold temperature, selectively controlling one or more valves associated with the condenser to open and cool fluid within the condenser.

* * * * *